US011514300B2

(12) United States Patent
Chen

(10) Patent No.: US 11,514,300 B2
(45) Date of Patent: Nov. 29, 2022

(54) RESISTOR CIRCUIT, ARTIFICIAL INTELLIGENCE CHIP AND METHOD FOR MANUFACTURING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 675 days.

(21) Appl. No.: 16/441,065

(22) Filed: Jun. 14, 2019

(65) Prior Publication Data

US 2020/0394501 A1 Dec. 17, 2020

(51) Int. Cl.

| | |
|---|---|
| ***G06N 3/063*** | (2006.01) |
| ***H01C 7/18*** | (2006.01) |
| ***H01L 49/02*** | (2006.01) |
| ***G06N 3/04*** | (2006.01) |

(52) U.S. Cl.

CPC .............. *G06N 3/063* (2013.01); *G06N 3/04* (2013.01); *H01C 7/18* (2013.01); *H01L 28/20* (2013.01)

(58) Field of Classification Search

CPC .......... H01C 7/18; H01L 28/20; G06N 3/063; G06N 3/04

See application file for complete search history.

(56) References Cited

U.S. PATENT DOCUMENTS

| | | | | |
|---|---|---|---|---|
| 5,164,699 A * | 11/1992 | Smith | H01L 23/5384 | 338/307 |
| 5,235,672 A | 8/1993 | Carson | | |
| 6,100,787 A * | 8/2000 | Huang | H05K 1/167 | 257/E23.173 |
| 7,425,740 B2 | 9/2008 | Liu et al. | | |
| 8,058,965 B2 * | 11/2011 | Block | H01G 4/12 | 338/273 |
| 8,227,897 B2 * | 7/2012 | Kim | H01L 28/20 | 257/536 |
| 8,373,440 B2 | 2/2013 | Strukov et al. | | |
| 8,373,537 B2 * | 2/2013 | Park | H01C 1/01 | 338/315 |

(Continued)

FOREIGN PATENT DOCUMENTS

| | | |
|---|---|---|
| CN | 1945829 A | 4/2007 |
| CN | 104701309 A | 6/2015 |

(Continued)

OTHER PUBLICATIONS

TIPO Office Action dated Feb. 4, 2020 in TW application (No. 108120588).

(Continued)

*Primary Examiner* — Kyung S Lee
(74) *Attorney, Agent, or Firm* — McClure, Qualey & Rodack, LLP

(57) ABSTRACT

A resistor circuit, an artificial intelligence chip and a method for manufacturing the same are provided. The resistor circuit includes a stack structure. The stack structure includes resistive material layers and insulating layers stacked alternately. The resistor circuit includes at least two unit resistors electrically connected in series or parallel. The at least two unit resistors are respectively defined in the resistive material layers of different layers.

18 Claims, 7 Drawing Sheets

(56) References Cited

U.S. PATENT DOCUMENTS

| | | | |
|---|---|---|---|
| 8,885,422 | B2 | 11/2014 | Ribeiro et al. |
| 9,431,099 | B2 | 8/2016 | Lee et al. |
| 9,514,818 | B1 | 12/2016 | Roizin et al. |
| 9,747,548 | B2 | 8/2017 | Ross et al. |
| 9,805,304 | B2 | 10/2017 | Ross |
| 9,960,116 | B2 * | 5/2018 | Ohshima ................. H01L 28/20 |
| 10,074,051 | B2 | 9/2018 | Thorson et al. |
| 10,242,737 | B1 | 3/2019 | Lin et al. |
| 10,447,274 | B2 | 10/2019 | Lee et al. |
| 2005/0156281 | A1 * | 7/2005 | Eshun ...................... H01C 7/06 257/E27.047 |
| 2009/0035560 | A1 * | 2/2009 | Block ...................... H01G 4/40 428/428 |
| 2010/0072574 | A1 * | 3/2010 | Ohshima ................ H01C 13/02 257/E29.325 |
| 2011/0106742 | A1 | 5/2011 | Pino |
| 2013/0130468 | A1 * | 5/2013 | Higashitani ............. H01L 28/20 257/E21.004 |
| 2017/0011827 | A1 * | 1/2017 | Miyauchi ............. H01C 7/1006 |
| 2018/0165573 | A1 | 6/2018 | Hsu et al. |
| 2018/0174025 | A1 | 6/2018 | Jin |
| 2019/0131523 | A1 | 5/2019 | Park et al. |
| 2019/0156208 | A1 | 5/2019 | Park et al. |

FOREIGN PATENT DOCUMENTS

| | | | |
|---|---|---|---|
| KR | 20190047884 | A | 5/2019 |
| TW | 200715477 | A | 4/2007 |
| TW | 201042732 | A | 12/2010 |
| TW | 201113986 | A | 4/2011 |
| TW | 201706872 | A | 2/2017 |
| TW | 201729124 | A | 8/2017 |
| TW | 201824092 | A | 7/2018 |
| TW | 201830297 | A | 8/2018 |
| TW | I641989 | B | 11/2018 |
| TW | 201917869 | A | 5/2019 |
| TW | 201921282 | A | 6/2019 |
| TW | 201921354 | A | 6/2019 |
| WO | 2018106969 | A1 | 6/2018 |

OTHER PUBLICATIONS

TIPO Office Action dated Feb. 19, 2020 in TW application (No. 108120589).

English translation of TIPO Office Action dated Feb. 19, 2020 in TW application (No. 108120589).

TW Office Action dated Sep. 18, 2020 in Taiwan application (No. 108120587).

Non-Final Office Action issued in U.S. Appl. No. 16/441,106, filed Jun. 14, 2019, dated Aug. 10, 2022.

Shibata, et al.: “A Neuron-MOS Neural Network Using Self-Learning-Compatible Synapse Circuits”; IEEE Journal of Solid-State Circuits, vol. 30, No. 8, Aug. 1995; pp. 913-922.

* cited by examiner

RESISTOR CIRCUIT, ARTIFICIAL INTELLIGENCE CHIP AND METHOD FOR MANUFACTURING THE SAME

BACKGROUND

Technical Field

The disclosure relates to a resistor circuit and a method for manufacturing the same, and particularly to a resistor circuit for an artificial intelligence (AI) chip.

Description of the Related Art

Recently, neuromorphic computing devices implemented by using memory arrays are proposed. Compared to those devices using processors to perform neuromorphic computations, the neuromorphic computing device has advantages of low power consumption. The neuromorphic computing device may be applied for an artificial intelligence (AI) chip.

The neuromorphic computing device usually includes a plurality of synapses, with each of which corresponds to a weighting value. When an input vector is applied to the neuromorphic computing device, the input vector is multiplied by a weighting vector consists of weighting values corresponding to one or more synapse relating to the input vector, so that a result of sum-of-product is obtained. The sum-of-product calculation is widely used in neuromorphic computing devices.

SUMMARY

The present disclosure relates to a resistor circuit, an artificial intelligence chip and a method for manufacturing the same. Unit resistors electrically connected with each other of the resistor circuit are respectively defined in resistive material layers of different layers in a stack structure.

According to an embodiment, a resistor circuit is provided. The resistor circuit comprises a stack structure. The stack structure comprises resistive material layers and insulating layers stacked alternately. The resistor circuit comprises at least two unit resistors electrically connected in series or parallel. The at least two unit resistors are respectively defined in the resistive material layers of different layers.

According to another embodiment, an artificial intelligence chip is provided. The artificial intelligence chip comprises a neuromorphic computing device. The neuromorphic computing device comprises a stack structure. The stack structure comprises resistive material layers and insulating layers stacked alternately. The neuromorphic computing device comprises a resistor circuit. The resistor circuit comprises at least two unit resistors electrically connected in series or parallel. The at least two unit resistors are respectively defined in the resistive material layers of different layers. The neuromorphic computing device comprises synapse units each comprising the resistor circuit.

According to yet another embodiment, a method for manufacturing a resistor circuit is provided. The method comprises the following steps. Insulating layers and resistive material layers are stacked alternately to form a stack structure. The stack structure is patterned. Openings are formed in the stack structure, Conductor elements are formed in the openings.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
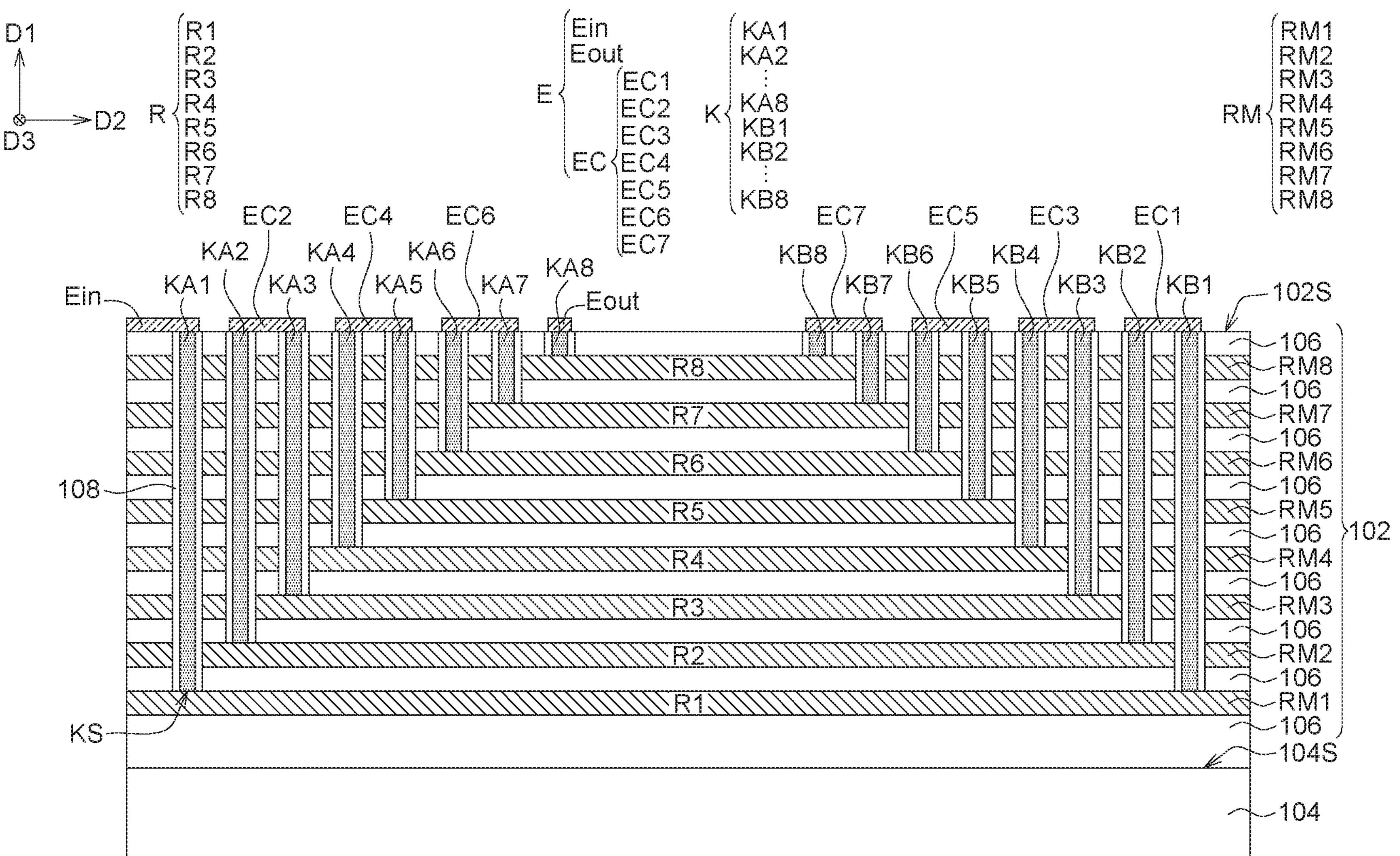
FIG. 1 illustrates a cross-section view of a resistor circuit according to an embodiment.

FIG. 1 illustrates a cross-section view of a resistor circuit according to an embodiment.

Referring to FIG. 1, a stack structure 102 may be disposed on a substrate 104. The stack structure 102 may comprise insulating layers 106 and at least two resistive material layers RM stacked alternately along a first direction D1 (for example, Z direction) substantially perpendicular to an upper surface 104S of the substrate 104. For example, the resistive material layers RM comprises a resistive material layer RM1 of a first layer, a resistive material layer RM2 of a second layer . . . and a resistive material layer RM8 of an eighth layer stacked from the substrate 104 in sequence. The disclosure is not limited thereto. In other embodiments, the stack structure 102 may comprise the resistive material layers RM and the insulating layers 106 of other quantities, such as 4 layers of the resistive material layers RM.

Insulating films 108 of different heights may be formed in the stack structure 102. Conductor elements KA1-KA8 and conductor elements KB1-KB8 are extended into the stack structure 102 along the first direction D1 (a Z direction, or a depth direction, or a height direction, or a thickness direction) from an upper surface 102S of the stack structure 102, and are electrically connected on the resistive material layers. In the present disclosure, the conductor elements KA1-KA8 and the conductor elements KB1-KB8 may be collectively referred to as "the conductor element K". The conductor elements K may be formed on sidewall surfaces of the insulating films 108. In addition, the conductor element K may comprise a bottom conductor portion KS in contact with one of the resistive material layers RM1-RM8. In this embodiment, the bottom conductor portion KS in contact with the resistive material layer RM is a bottom surface of the conductor element K. The other upper portion of the conductor element K may be separated from the resistive material layer RM of an upper layer by the insulating film 108. For example, the bottom conductor portions KS of the conductor element KA1 and the conductor element KB1 are electrically connected with the resistive material yer RM1 of the first layer, and the other portions of the conductor element KA1 and the conductor element KB1 are separated from the resistive material layers RM2-RM8 by the insulating films 108. The bottom conductor portions KS of the conductor element KA2 and the conductor element KB2 are electrically connected with the resistive material layer RM2 of the second layer, and the other portions of the conductor element KA2 and the conductor element KB2 are separated from the resistive material layers RM3-RM8 by the insulating films 108. Arrangement for the other conductor elements K and resistive material layers RM may be analogous thereto. In an embodiment, the insulating film 108 may have a ring shape, and may surround a sidewall surface of the conductor element K. In an embodiment, the conductor element K may have a pillar shape, such as a round pillar shape, but is not limited thereto, and may have other suitable shapes.

In embodiments, the resistor circuit comprises at least two unit resistors R respectively formed in the different resistive material layers RM. Pairs of the conductor elements K of different heights (or sizes in the first direction D1) are respectively in contact with different portions of the different resistive material layers RM. It results in unit resistors R in the resistive material layers RM and electrically connected between the pairs of the conductor elements. One of the pair of the conductor elements K is functioned as an input terminal of the unit resistor R, and the other of the pair of the conductor elements K is functioned as an output terminal of the unit resistor R. For example, the conductor element KA1 and the conductor element KB1 as a pair having the same first height are in contact with different portions of the resistive material layer RM1, which defines a unit resistor R1 electrically connected between the conductor element KA1 and the conductor element KB1 in the resistive material layer RM1. For example, the conductor element KA8 and the conductor element KB8 as a pair having the same eighth height are in contact with different portions of the resistive material layer RM8, which defines a unit resistor R8 electrically connected between the conductor element KA8 and the conductor element KB8 in the resistive material layer RM8. Definition for other unit resistors R2-R7 in the resistive material layers RM2-RM7 with the conductor elements K may be analogous to thereto.

In this embodiment, the conductor elements K are arranged along a second direction D2 (for example, a X direction) with the conductor elements KA1 to KA8 arranged from left to right in sequence as a staircase arrangement, and the conductor elements KB1 to KB8 arranged from left to right in sequence as a staircase arrangement. With the arrangement, the pair of the conductor element KA1 and the conductor element KB1 having the first height has the maximum gap distance (for example, in the second direction D2) therebetween, and the other pairs of the conductor elements K having smaller heights have smaller gap distances (for example, in the second direction D2) therebetween. For example, the pair of the conductor element KA8 and the conductor element KB8 having the eighth height has the minimum gap distance therebetween. In an embodiment, resistances of the unit resistors R of the different layers are proportional to gap distances between the conductor elements K. Therefore, the unit resistor R1 in the resistive material layer RM1 of the first layer has the maximum resistance, and the other unit resistors R of the upper layers have smaller resistances. In other words, R1>R2>R3>R4>R5>R6>R7>R8. However, the present disclosure is not limited thereto. Conditions of the resistive material layers RM and the conductor elements K may be properly varied according to actual demands for obtaining expected unit resistors R in the resistive material layers RM. In other embodiments, for example, resistances of the unit resistors R of different layers may be the same or different flexibly varied by controlling factors influencing effective resistance such as a shape, a gap distance, a contact area with the resistive material layer RM, or contact location with the resistive material layer RM of the corresponding pair of the conductor elements, and/or a size, a material, or a shape of the resistive material layers RM, or other factors. For example, the resistive material layers RM may have the same or different thickness. The resistive material layers RM may have the same or different material characteristic. The resistive material layer RM may comprise a semiconductor material such as a silicon material such as poly-silicon, or a carbon based material, or a metal nitride such as TiN, TaN, etc., or other suitable resistor materials. The resistive material layer RM may comprise a N-type semiconductor material or a P-type semiconductor material. For example, the resistive material layers RM may have the same or different doped characteristic. For example, the resistive material layers RM may have the same or different dopant impurity, and/or have the same or different dopant concentration. The dopant impurity may comprise an element of P, B, In, C, N and so on.

For example, in an embodiment, R1:R2:R3:R4=1:1:1:1. In an embodiment, R1:R2:R3:R4=1:2:4:8. In an embodiment, R1:R2:R3:R4=1:2:4:12. In an embodiment, R1:R2:R3:R4=1:3:9:27. In an embodiment, R1=R2=R3. In an embodiment, R1<R2<R3. In an embodiment, R3=2R1=4R2. In an embodiment, R1=3R2=9R3. In an embodiment, R1=R2=R3<R4=R5=R6. In an embodiment, R1=R2=R3>R4=R5=R6. In an embodiment, R3=2R1=4R2. In an embodiment, R1=3R2=9R3.

In another embodiment, the conductor elements KA1-KA8 and KB1-KB8 may be arranged in a staggered manner or other configurations.

A conductor layer E may be formed on the upper surfaces of the stack structure 102, the conductor elements K and the insulating films 108, and electrically connected onto the conductor elements K. The conductor element K may be electrically connected between the conductor layer E and the resistive material layer RM. In embodiments, an electrical connection relationship between the unit resistors R of the different resistive material layers RM and/or an effective resistance of the resistor circuit may be resulted through a pattern arrangement of the conductor layer E. For example, in this embodiment, the conductor layer E comprises an input conductor portion Ein, an output conductor portion Ea t, and connection conductor portions EC separated from each other. The connection conductor portions EC may comprise connection conductor portions EC1-EC7 separated from each other. The input conductor portion Ein functioned as an input terminal of the resistor circuit is electrically connected with at least one of the conductor elements K, being the conductor element KA1 in this embodiment. The output conductor portion Eout functioned as an output terminal of the resistor circuit is electrically connected with at least one of the conductor elements K, being the conductor element KA8 in this embodiment. The connection conductor portions EC are electrically connected between the input conductor portion Ein and the output conductor portion Eout through the conductor elements K and the resistive material layers RM.

The connection conductor portions EC are electrically connected with at least two of the conductor elements K of different heights so as to make the unit resistors R of the different layers electrically connected to each other. For example, in this embodiment, the connection conductor portion EC1 is electrically connected on the conductor element KB1 and the conductor element KB2 so as to make the unit resistor R1 electrically connected with unit resistor R2 in series. The connection conductor portion EC2 is electrically connected on the conductor element KA2 and the conductor element KA8 so as to make the unit resistor R2 electrically connected with unit resistor R3 in series. Other relationships of the other connection conductor portions EC3-EC7 and the other conductor elements KA4-KA7 and KB3-KB8 shown in FIG. 1 may be analogous thereto.

In embodiments, the resistances of the resistive material layers RM may be larger than the resistances of the conductor elements K and the conductor layer E so that a total effective resistance of the resistor circuit would be substantially constructed by the unit resistors R in the resistive material layers. For example, the conductor elements K and the conductor layer E may be contact elements having high conductivity.

Figure 2:
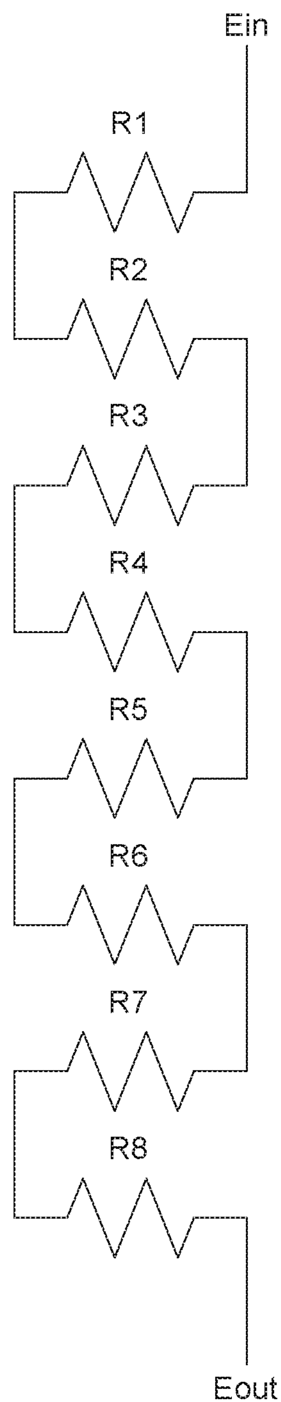
FIG. 2 illustrates an equivalent circuit of the resistor circuit of FIG. 1.

In an embodiment, the resistor circuit shown in FIG. 1 comprises the unit resistors R1-R8 electrically connected in series between the input conductor portion Ein and the output conductor portion Eout, an equivalent circuit diagram of which may be shown as FIG. 2. In this embodiment, an effective resistance Rio of the resistor circuit may be substantially a sum of the unit resistors R1-R8 electrically connected in series. In other words, Rio=R1+R2+R3+R4+R5+R6+R7+R8.

In another embodiment, the resistor circuit may comprise the unit resistors R electrically connected in parallel obtained through a pattern arrangement of the conductor layer E. Alternatively, a portion of the unit resistors R in the resistive material layers RM may be floating.

Figure 3:
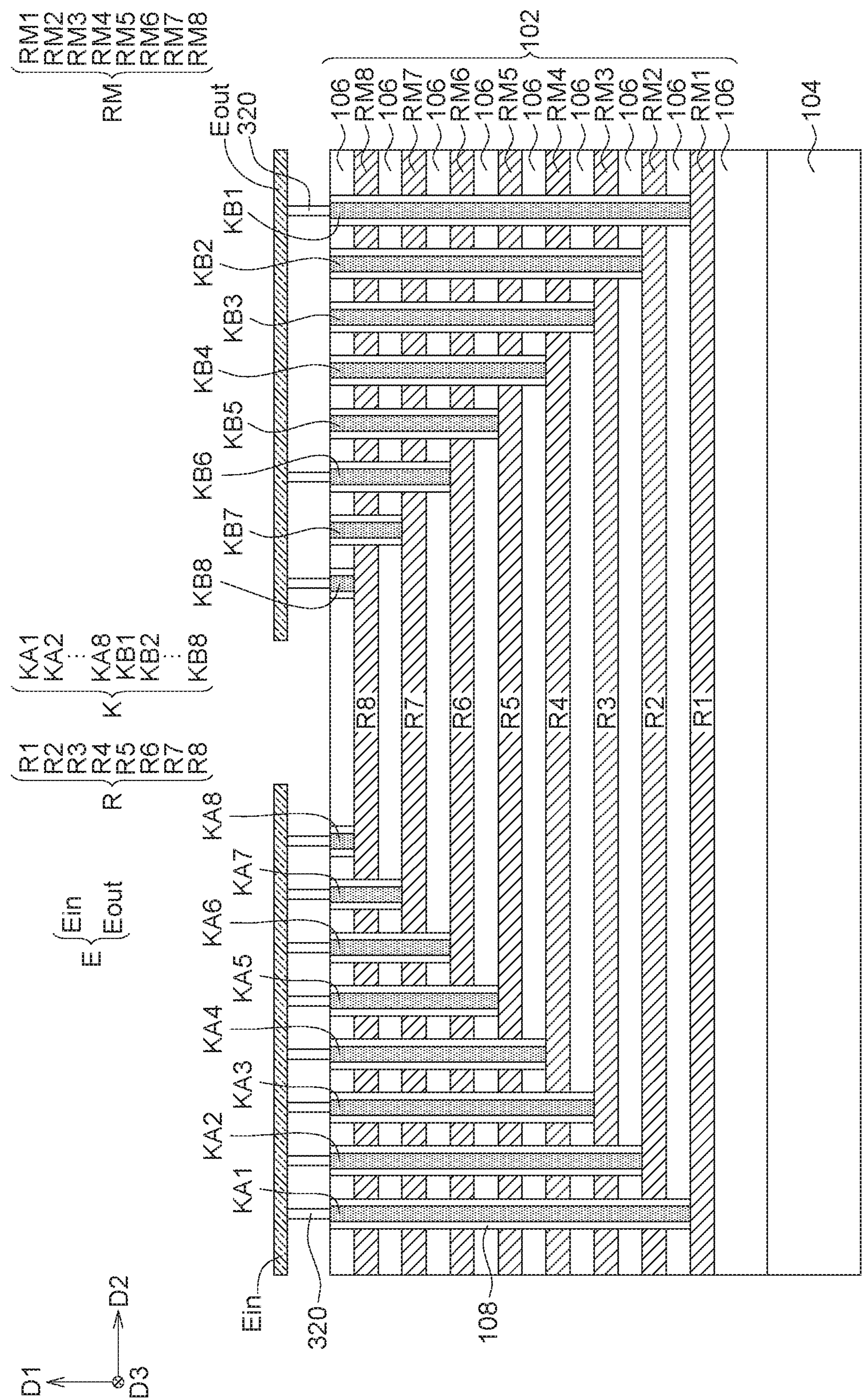
FIG. 3 illustrates a cross-section view of a resistor circuit according to an embodiment.

For example, FIG. 3 shows a resistor circuit, which is different from the resistor circuit shown in FIG. 1 with the following illustrations. The conductor layer E comprises the input conductor portion Ein and the output conductor portion Eout. The input conductor portion Ein is electrically connected on contact vias 320 on the conductor elements KA1-KA8. The output conductor portion Eout is electrically connected on the contact vias 320 on the conductor elements KB1, KB6 and KB8. The conductor layer E is not electrically connected with the conductor elements KB2-KB5 and KB7. Therefore, the conductor elements KB2-KB5 and KB7 and the resistive material layers RM2-RM5 and RM7 (or the unit resistors R2-R5 and R7) which the conductor elements KB2-KB5 and KB7 connect with are floating. In this embodiment, the relationship of the total resistance Rio of the resistor circuit and resistances of the unit resistors R may be represented as Rio=1/R1+1/R6+1/R8.

In another embodiment, for example, a resistor circuit (not shown) may be formed by changing the output conductor portion Eout shown in FIG. 3 into being electrically connected on the conductor elements KB1-KB8 at the same time, or being electrically connected on the contact vias 320 on the conductor elements KB1-KB8 at the same time, so that the resistor circuit has an equivalent circuit resulted from the unit resistors R1-R8 electrically connected in parallel. The relationship of the total resistance Rio of such resistor circuit and resistances of the unit resistors R1-R8 may be represented as 1/Rio=1/R1+1/R2+1/R3+1/R4+1/R5+1/R6+1/R7+1/R8.

Figure 4:
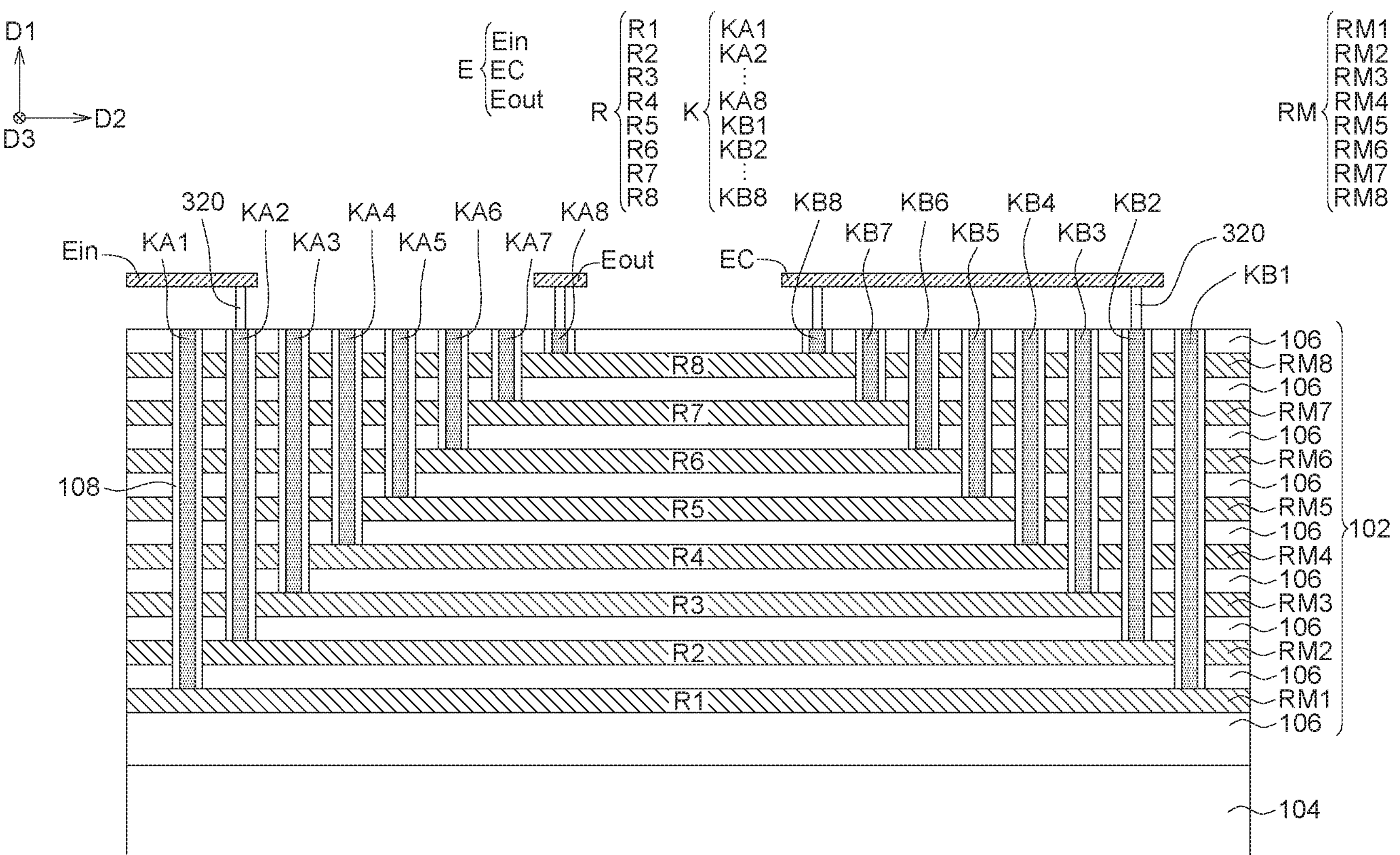
FIG. 4 illustrates a cross-section view of a resistor circuit according to an embodiment.

FIG. 4 shows a cross-section of a resistor circuit, which is different from the resistor circuit shown in FIG. 1 with the following illustrations. The conductor layer E comprises the input conductor portion Ein, the output conductor portion Eout, and the connection conductor portion EC separated from each other. The input conductor portion Ein is electrically connected on the contact via 320 on the conductor element KA2. The output conductor portion Eout is electrically connected on the contact via 320 on the conductor element KA8. The connection conductor portion EC is electrically connected on the contact vias 320 on the conductor element KB2 and the conductor element KB8. The conductor layer E is not electrically connected with the conductor elements KA1, KA3-KA7, KB1 and KB-KB7. Therefore, the conductor elements KB2-KB5 and KB7 and the resistive material layers RM1 and RM3-RM7 (or the unit resistors R1 and R3-R7) which the conductor elements KA3-KA7, KB1 and KB3-KB7 connect with are floating. In this embodiment, the relationship of the total resistance Rio of the resistor circuit and the resistances of the unit resistors R may be represented as Rio=R2+R8.

In yet another embodiment, the resistor circuit may comprise the unit resistors R with a portion of which electrically connected in parallel, and another portion of which electrically connected in series, obtained through a pattern arrangement of the conductor layer E.

Figure 5:
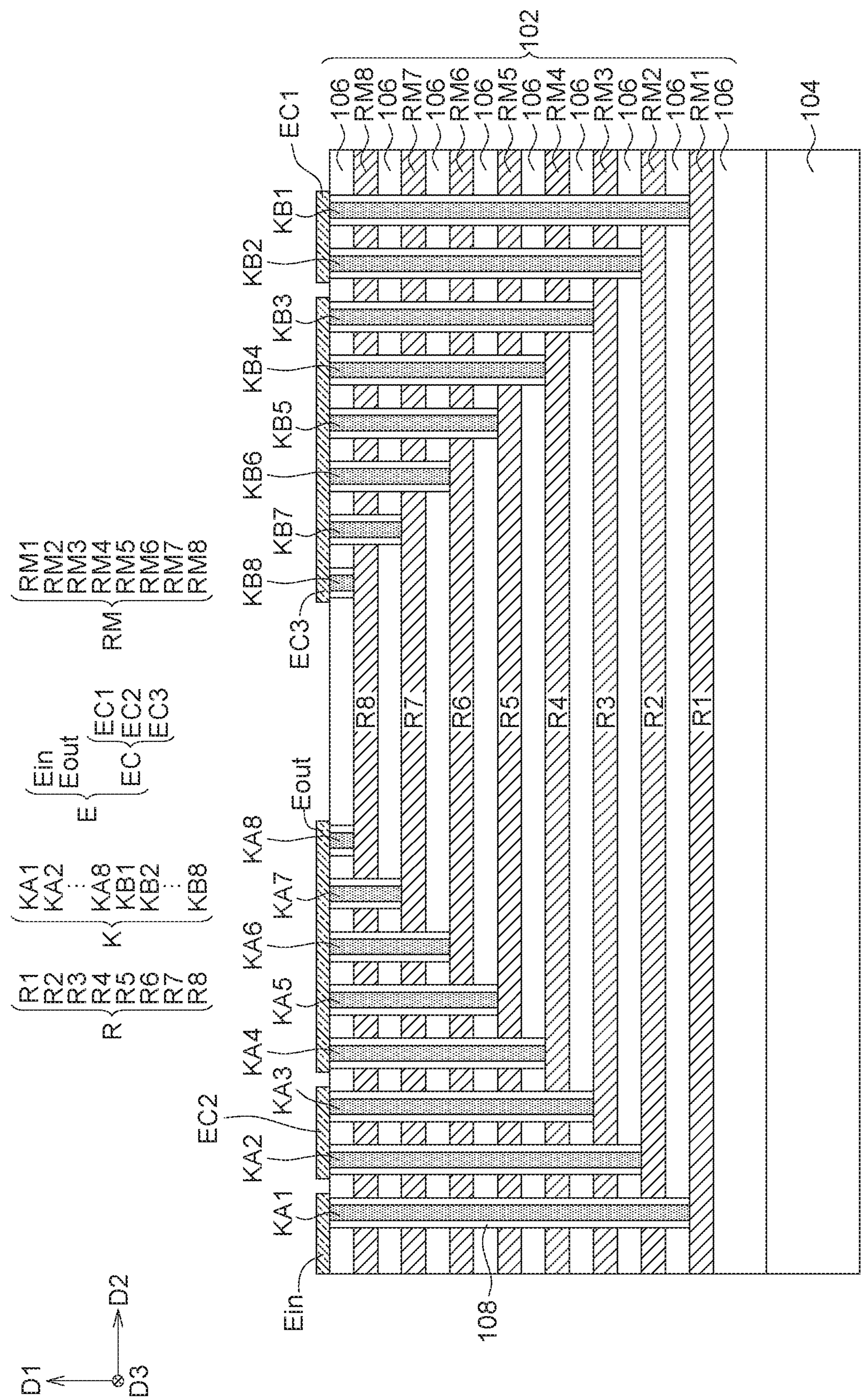
FIG. 5 illustrates a cross-section view of a resistor circuit according to an embodiment.

FIG. 5 shows a cross-section of a resistor circuit, which is different from the resistor circuit shown in FIG. 1 with the following illustrations. The conductor layer E comprises the input conductor portion Ein, the output conductor portion Eout, and the connection conductor portions EC separated from each other. The connection conductor portions EC may comprise the connection conductor portions EC1-EC3 separated from each other. The input conductor portion Ein is electrically connected on the conductor element KA1. The output conductor portion Eout is electrically connected on the conductor elements KA4-KA8. The connection conductor portion EC1 is electrically connected on the conductor elements KB1 and KB2. The connection conductor portion EC2 is electrically connected on the conductor elements KA2 and KA3. The connection conductor portion EC3 is electrically connected on the conductor elements KB3-KB8. In this embodiment, the resistor circuit comprises a parallel resistor Rp substantially constructed by the unit resistors R4-R8, which is electrically connected in series with the other unit resistors R1-R3. Therefore, the relationship of the total resistance Rio of such resistor circuit and resistances of the unit resistors R1-R8 may be represented as Rio=R1+R2+R3+Rp, wherein 1/Rp=1/R4+1/R5+1/R6+1/R7+1/R8.

In embodiments, the resistor circuit may be applied into any suitable semiconductor circuit. In an embodiment, each of synapse units of a neuromorphic computing device for an artificial intelligence (AI) chip may comprise the resistor circuit according to concepts of embodiments according to the present disclosure. In an embodiment, the resistor circuit may be disposed in a semiconductor package structure, such as a multi-chip package. For example, the resistor circuit may be electrically connected to a chip through a technique of wire bonding, micro-bump, Si-interposer, and so on. In an embodiment, the resistor circuit may be formed on a Si-interposer circuit board. However, the present disclosure is not limited thereto. The resistor circuit may be applied for other semiconductor device or electric devices according to actual demands.

Figure 6:
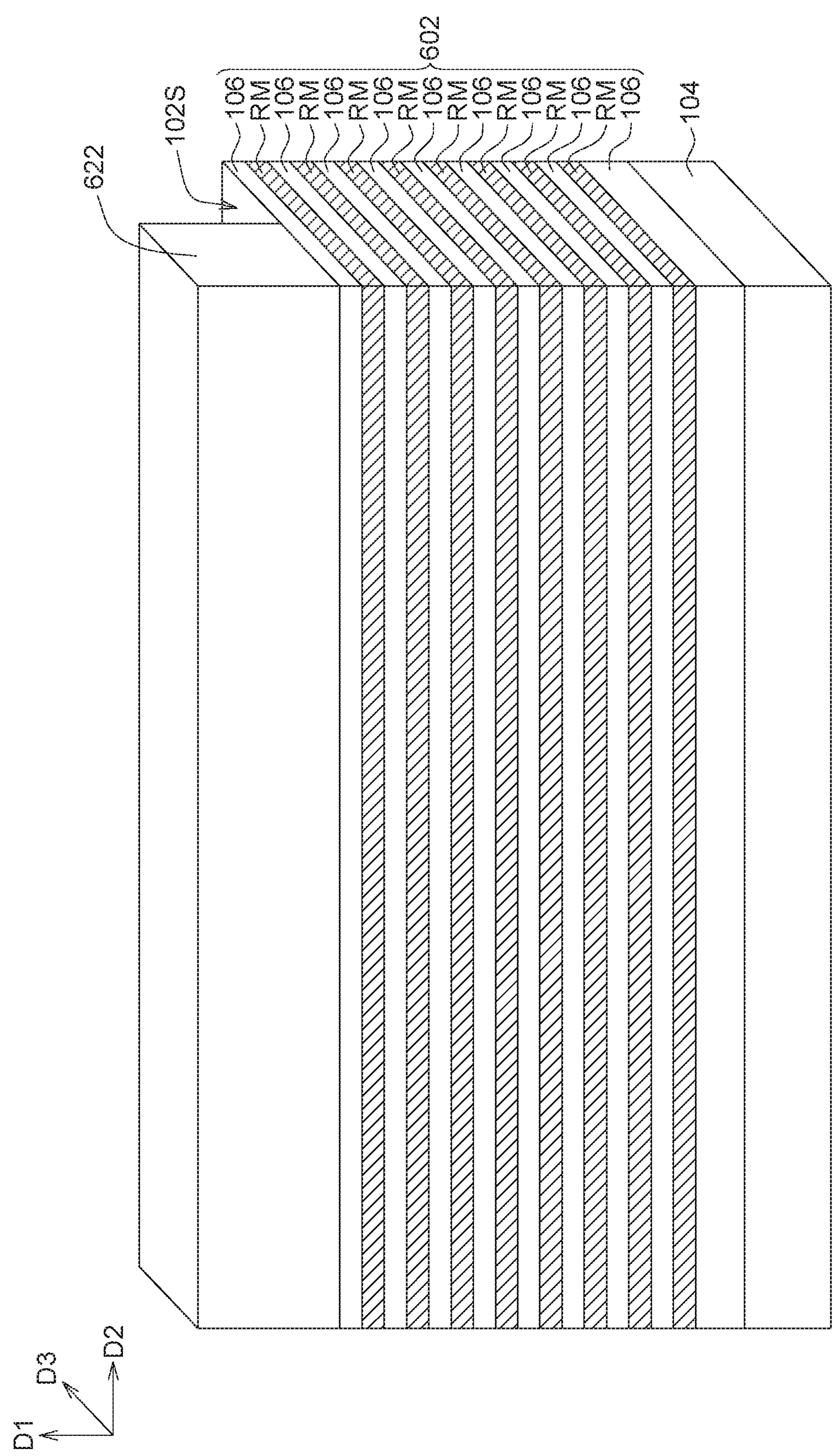
FIG. 6 to FIG. 7 illustrates steps in a method for manufacturing a resistor circuit according to an embodiment.
Figure 7:
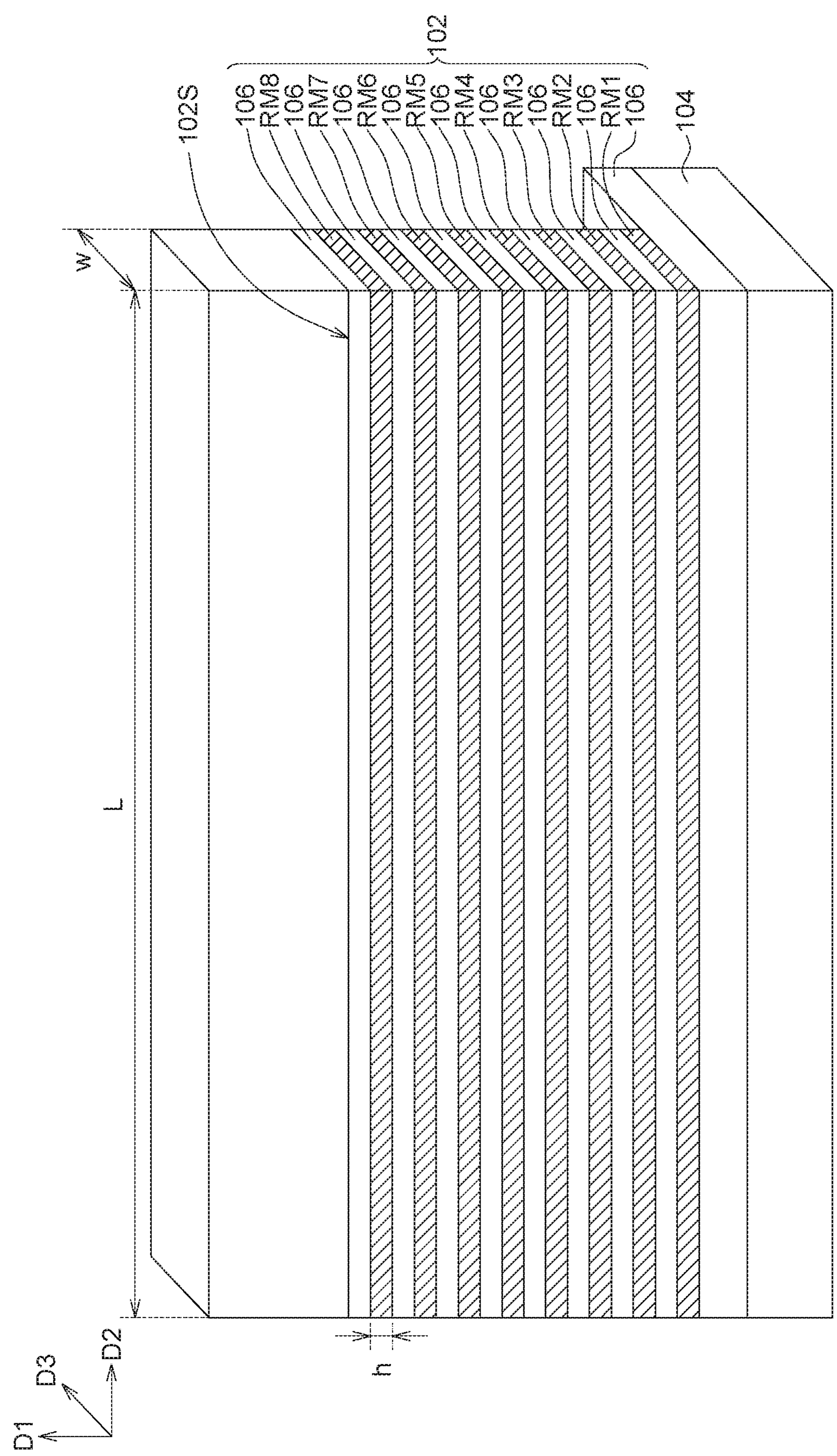

FIG. 6 to FIG. 7 illustrate steps in a method for manufacturing a resistor circuit according to an embodiment.

Referring to FIG. 6, a stack structure 602 is formed by stacking the insulating layers 106 and the resistive material layers RM alternately on the substrate 104. For example, the substrate 104 may comprise a silicon substrate, but is not limited thereto. The substrate 104 may comprise other suitable substrate materials. The insulating layers 106 may comprise a silicon oxide, a silicon nitride, a silicon oxynitride, or other suitable dielectric materials, which may be formed by a deposition method, but the present disclosure is not limited thereto. The resistive material layers RM may comprise a semiconductor material such as a N-type semiconductor material or a P-type semiconductor material, for example doped with dopants of P, B, In, C, N and so on, or a carbon based material, or a metal nitride such as TiN, TaN, but are not limited thereto. The resistive material layers RM may use other suitable resistor materials.

Referring to FIG. 6, then, a patterning step may be performed to the stack structure 602 with a photolithography process. For example, a patterned photoresist layer 622 may be formed to cover a portion of the upper surface 102S of the stack structure 602, and then the pattern of the photoresist layer 622 may be transferred down into the stack structure 602. Specifically, an etching step using the photoresist layer 622 (or a hard mask) as an etching mask may be performed to remove a portion of the stack structure 602 not covered by the photoresist layer 622 (or the hard mask) so as to form the patterned stack structure 102 show in FIG. 7. In an embodiment, all of the resistive material layers RM1-RM8 of the stack structure 102 of the resistor circuit are formed by being patterned at the same time with using the same photoresist layer 622. Therefore the outer sidewalls of the resistive material layers RM1-RM8 of the different layers are aligned with each other. In addition, the resistive material layers RM1-RM8 may have the same pattern as the photoresist layer 622. Specifically, the resistive material layers RM1-RM8 may have the same outer sidewall profile. In an embodiment, for example, in a top view, an upper surface of the photoresist layer 622 has a rectangular shape. Therefore, the resistive material layers RM1-RM8 formed by a patterning step with using the photoresist layer 622 also have the same rectangular shape, and have the outer sidewalls having the identical rectangular profile. However, the present disclosure is not limited thereto. The stack structure 102 may have a pattern of other suitable shapes such as a triangular shape, a square shape, a L shape, other polygon shapes, regular shapes, irregular shapes, a ring shape, a circle shape, and so on. Then, for example, a CMP method or other suitable etching methods may be used to remove the photoresist layer 622, or further flat the upper surface 102S of the stack structure 102.

In an embodiment, each of the resistive material layers RM1-RM8 may a thickness h (or a size of the first direction D1, or a height), a length L (or a size of the second direction D2) and a width w (or a size of a third direction D3 such as a Y direction). For example, $h<w$. $10h<L$. In an embodiment, the resistive material layers RM1-RM8 have the same thickness h. However, the present disclosure is not limited thereto. Conditions of the resistive material layers RM may be properly varied according to actual demands.

Then, for example, Referring to FIG. 1, openings of different depths may be formed in the stack structure 102, respectively exposing the resistive material layers RM1-RM8 of different layers. The openings may be formed by an etching step with using a patterned photoresist layer or hard mask (not shown) as an etching mask to remove a portion of the stack structure 102. The insulating films 108 may be formed on sidewall surfaces of the stack structure 102 exposed by the openings. The substrate 104 may comprise other suitable substrate materials. The insulating films 108 may comprise a silicon oxide, a silicon nitride, a silicon oxynitride, or other suitable dielectric materials, which may be formed by a deposition method, but the present disclosure is not limited thereto. The conductor elements KA1-KA8, KB1-KB8 may be formed on sidewalls of the insulating films 108 in the openings and the resistive material layers RM1-RM8 exposed by the openings. For example, a CMP method or other suitable etching methods may be used to flat the upper surfaces of the stack structure 102 and the conductor elements KA1-KA8 and KB1-KB8 and the insulating films 108 formed in the stack structure 102. A conductor material film may be formed on the stack structure 102, the conductor elements KA1-KA8 and KB1-KB8 and the insulating films 108. For example, the conductor material film may comprise a suitable metal such as W, Al, Cu, or a metal silicide or other suitable material having a high conductivity, which may be formed by a deposition method, but the present disclosure is not limited thereto. An etching step using a patterned photoresist layer or hard mask (not shown) as an etching mask may be performed to remove a portion of the conductor material film to form the patterned the conductor layer E. The conductor layer E comprises at least the input conductor portion Ein and the output conductor portion Eout, and may further comprise at least one the connection conductor portion EC separated from each other.

In another embodiment, for example, referring to FIG. 3, the contact vias 320 may be formed on the conductor elements K, The contact vias 320 may be formed in a dielectric layer (not shown) formed on the upper surfaces of the stack structure 102, the conductor elements K and the insulating films 108. The contact vias 320 may be formed by a method comprising forming a patterned photoresist layer or hard mask (not shown) on the dielectric layer, performing an etching step using the patterned photoresist layer or hard mask as an etching mask to transfer the pattern down into the dielectric layer to form openings, and filling the openings with a conductive material. The conductive material for the contact vias 320 may comprise a suitable metal such as W, Al, Cu, or a metal silicide or other suitable material having a high conductivity. The conductor layer E may be formed on upper surfaces of the contact vias 320 and the dielectric layer (not shown).

According to the embodiments, the present disclosure provides a resistor circuit constructed with the unit resistors respectively defined in the resistive material layers of different layers in a stack structure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistor circuit, comprising:

a stack structure comprising resistive material layers and insulating layers stacked alternately, wherein the resistor circuit comprises at least two unit resistors electrically connected in series or parallel, the at least two unit resistors are respectively defined in the resistive material layers of different layers;

conductor elements disposed in the stack structure, wherein the at least two unit resistors are respectively defined between different pairs of the conductor elements; and an insulating film surrounding sidewall surfaces of the conductor elements, wherein the conductor elements have a pillar shape;

wherein the stack structure further comprises a top insulating layer on the resistive material layer and the insulating layers, and a top surface of the insulating film is flush with a top surface of the top insulating layer.

2. The resistor circuit according to claim 1, wherein at least one of the resistive material layers is floating.

3. The resistor circuit according to claim 1, wherein the at least two unit resistors have the same or different resistance.

4. The resistor circuit according to claim 1, wherein the resistor circuit has an effective resistance resulted from the at least two unit resistors.

5. The resistor circuit according to claim 1, wherein the at least two unit resistors are electrically connected in series.

6. The resistor circuit according to claim 1, wherein the at least two unit resistors are electrically connected in parallel.

7. The resistor circuit according to claim 1, wherein the resistive material layers have outer sidewalls aligning with each other.

8. The resistor circuit according to claim 1, further comprising a conductor layer disposed on the stack structure and electrically connected to the conductor elements, wherein the conductor layer comprises an input conductor portion and an output conductor portion, the resistor circuit is defined between the input conductor portion and the output conductor portion.

9. The resistor circuit according to claim 8, wherein the conductor elements are electrically connected between one of the resistive material layers and the conductor layer.

10. The resistor circuit according to claim 8, wherein the conductor layer further comprises a connection conductor portion electrically connected to at least two of the conductor elements and electrically connected between the input conductor portion and the output conductor portion.

11. The resistor circuit according to claim 10, wherein the connection conductor portion electrically connects the conductor elements of different heights.

12. The resistor circuit according to claim 1, wherein the conductor elements are extended into the stack structure with different depths from an upper surface of the stack structure.

13. The resistor circuit according to claim 1, wherein the at least two unit resistors comprises:

one unit resistor defined in one resistive material layer of the resistive material layers; and another one unit resistor defined in another one resistive material layer of the resistive material layers, the one resistive material layer and the another one resistive material layer contain a silicon material.

14. The resistor circuit according to claim 13, wherein the one unit resistor and the another one unit resistor have different resistances, and the one resistive material layer and the another one resistive material layer have different dopant impurity and/or dopant concentration.

15. The resistor circuit according to claim 1, wherein the resistive material layers comprise a carbon based material or a metal nitride, wherein the metal nitride comprises TiN or TaN.

16. An artificial intelligence chip, comprising a neuromorphic computing device comprising:

a stack structure comprising resistive material layers and insulating layers stacked alternately, wherein the neuromorphic computing device comprises a resistor circuit, the resistor circuit comprises at least two unit resistors electrically connected in series or parallel, the at least two unit resistors are respectively defined in the resistive material layers of different layers, the neuromorphic computing device comprises synapse units each comprising the resistor circuit;

conductor elements disposed in the stack structure, wherein the at least two unit resistors are respectively defined between different pairs of the conductor elements; and an insulating film surrounding sidewall surfaces of the conductor elements, wherein the conductor elements have a pillar shape;

wherein the stack structure further comprises a top insulating layer on the resistive material layer and the insulating layers, and a top surface of the insulating film is flush with a top surface of the top insulating layer.

17. A method for manufacturing a resistor circuit, comprising: stacking insulating layers and resistive material layers alternately to form a stack structure, wherein the resistor circuit comprises at least two unit resistors electrically connected in series or parallel, the at least two unit resistors are respectively defined in the resistive material layers of different layers;

patterning the stack structure;

forming openings in the stack structure; and forming conductor elements in the openings; wherein the conductor elements are disposed in the stack structure, wherein the at least two unit resistors are respectively defined between different pairs of the conductor elements; and forming an insulating film surrounding sidewall surfaces of the conductor elements, wherein the conductor elements have a pillar shape;

wherein the stack structure further comprises a top insulating layer on the resistive material layer and the insulating layers, and a top surface of the insulating film is flush with a top surface of the top insulating layer.

18. The method for manufacturing a resistor circuit according to claim 17, further comprising forming a conductor layer on the stack structure and the conductor elements.

* * * * *